(12) United States Patent
Kim et al.

(10) Patent No.: US 7,785,910 B2
(45) Date of Patent: Aug. 31, 2010

(54) LIGHT EMITTING DEVICE HAVING PROTRUSION AND RECESS STRUCTURE AND METHOD OF MANUFACTURING THE SAME

(75) Inventors: Hyun-soo Kim, Hwaseong-si (KR); Jeong-wook Lee, Seongnam-si (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/215,407

(22) Filed: Jun. 27, 2008

(65) Prior Publication Data

US 2008/0286893 A1    Nov. 20, 2008

Related U.S. Application Data

(62) Division of application No. 11/453,866, filed on Jun. 16, 2006, now abandoned.

(30) Foreign Application Priority Data

Jun. 16, 2005    (KR) .................... 10-2005-0052044

(51) Int. Cl.
    *H01L 21/00* (2006.01)
(52) U.S. Cl. ........................... 438/31; 438/22; 438/46; 438/29
(58) Field of Classification Search ................ 438/31, 438/22, 24, 46, 47, 29, 956, 39
    See application file for complete search history.

(56) References Cited

U.S. PATENT DOCUMENTS

| 6,051,847 | A | 4/2000 | Oku et al. |
| 6,551,848 | B2 * | 4/2003 | Kwak et al. .................... 438/22 |
| 6,969,873 | B2 | 11/2005 | Hata et al. |
| 2005/0082562 | A1 * | 4/2005 | Ou et al. ...................... 257/103 |
| 2006/0054907 | A1 | 3/2006 | Lai |

FOREIGN PATENT DOCUMENTS

| JP | 2002-01632 | 1/2002 |
| KR | 2005-36737 | 4/2005 |

OTHER PUBLICATIONS

Office Action issued by Korean Intellectual Property Office on Mar. 24, 2008 (with English Translation).

* cited by examiner

*Primary Examiner*—Chuong Anh Luu
(74) *Attorney, Agent, or Firm*—Buchanan Ingersoll & Rooney PC

(57) ABSTRACT

The semiconductor light emitting device having a protrusion and recess structure includes: a lower clad layer disposed on a substrate; an active layer formed on one portion of a top surface of the lower clad layer; an upper clad layer formed on the active layer; a first electrode formed on the upper clad layer; and a second electrode that is formed on a protrusion and recess structural pattern region formed on a portion of the top surface of the lower clad layer not occupied by the active layer.

5 Claims, 7 Drawing Sheets

LIGHT EMITTING DEVICE HAVING PROTRUSION AND RECESS STRUCTURE AND METHOD OF MANUFACTURING THE SAME

CROSS-REFERENCE TO RELATED PATENT APPLICATION

Priority is claimed to Korean Patent Application No. 10-2005-0052044, filed on Jun. 16, 2005, in the Korean Intellectual Property Office, the disclosure of which is incorporated herein in its entirety by reference. This application is a DIV. of Ser. No. 11/453,866 Jun. 16, 2006 now ABN.

BACKGROUND OF THE DISCLOSURE

1. Field of the Disclosure

The present disclosure relates to a semiconductor light emitting device, and more particularly, to a semiconductor light emitting device having a protrusion and recess structure that is disposed at an interface between a lower clad layer and a side electrode to improve the light extraction efficiency and is formed using a simple manufacturing process and a method of manufacturing the same.

2. Description of the Related Art

A conventional light emitting diode (LED) produces a signal in the form of infrared rays, visible rays, or light from electrical energy using characteristics of a compound semiconductor. A light emitting diode can be electroluminescent (EL) diodes or light emitting diodes using Group III-V compound semiconductor, which are in practical use.

A Group III nitride-based compound semiconductor is a direct transition type semiconductor, and can be used to achieve a more stable operation at a high temperature than other devices using different semiconductors. Therefore, Group III nitride-based compound semiconductors are widely used in light emitting devices such as LEDs and laser diodes (LDs). In general, such Group III nitride-based compound semiconductors are formed on sapphire ($Al_2O_3$) substrates. In order to improve light extraction efficiency, research has been conducted on LEDs with various structures, especially on a protrusion and recess structure disposed in light extraction regions of a light emitting device.

At an interface of material layers having different refractive indexes, the transmission of light is dependent on the refractive indexes of the material layers. In the case of a flat interface, when the light is incident from a semiconductor layer with a high refractive index (n=2.5) to an air layer with a low refractive index (n=1), the light is transmitted when the angle of incidence is below a predetermined angle ($\theta$). When the angle of incidence is greater than a predetermined angle, the light is totally reflected at the flat interface, progressed in a lateral direction, and is finally trapped in the LED. Thus, the light extraction efficiency is greatly decreased. The use of a protrusion and recess structure at an interface has been proposed to address this problem.

FIGS. 1 and 2 are cross-sectional views of conventional semiconductor light emitting devices having the protrusion and recess structure.

The semiconductor light emitting device illustrated in FIG. 1 has a PSS (patterned sapphire substrate) structure. Referring to FIG. 1, a GaN buffer layer 11 and a GaN layer 12 are sequentially formed on the sapphire substrate 10. An n-GaN clad layer 13 is formed on the GaN layer 12 and an active layer 14 having a MQW (multi quantum well) structure, a p-GaN clad layer 15 and first and second p-electrode layers 16 and 17 are sequentially formed on the upper surface of one portion of the n-GaN clad layer 13. The first and second p-electrode layers 16 and 17 are respectively a mesh-type p-electrode 16 and a p-electrode pad 17. An n-electrode layer 18 is formed on the upper surface of the other portion of the n-GaN clad layer 13.

Here, the protrusion and recess structure is formed on the sapphire substrate 10. The GaN buffer layer 11 conforms to the structure of the sapphire substrate 10 and the GaN layer 12 has a lower surface that corresponds to the protrusion and recess structure of the GaN buffer layer 11, and a flat upper surface. The light emitting device having the protrusion and recess structure has an advantage in that the light generated from the active layer 14 can be scattered toward the sapphire substrate 10 rather than being trapped. However, a process of forming the protrusion and recess structure on the sapphire substrate 10 is complicated and has a low yield.

In the semiconductor light emitting device of FIG. 2, an n-GaN clad layer 21 is formed on a sapphire substrate 20 and an active layer 22, a p-GaN clad layer 23, a p-type transparent electrode 24 and a p-electrode pad 25 are formed on the upper surface of one portion of the n-GaN clad layer 21. An n-electrode layer 26 is formed on the other portion of the n-GaN clad layer 21. Here, the protrusion and recess structure exists on the surface of the p-GaN clad layer 23. In this structure, the light emitting device has an advantage in that the light generated from the active layer 22 can be scattered toward the p-type transparent electrode 24 rather than being trapped. However, since the thickness of the p-GaN clad layer 23 where the protrusion and recess structure is formed is approximately 0.2 μm, the efficiency of scattering is relatively low. In addition, on the surface of the p-GaN clad layer 23 where the protrusion and recess structure is locally formed, ohmic contact resistance is high, and thus, an operating voltage of the light emitting device is high.

SUMMARY OF THE DISCLOSURE

The present disclosure provides a semiconductor light emitting device having a protrusion and recess structure that can improve light extraction efficiency and can be manufactured through a simple process, and a method of manufacturing the same.

According to an aspect of the present disclosure, there is provided a semiconductor light emitting device having a protrusion and recess structure, the device including: a lower clad layer disposed on a substrate; an active layer formed on one portion of a top surface of the lower clad layer; an upper clad layer formed on the active layer; a first electrode formed on the upper clad layer; and a second electrode that is formed on a protrusion and recess structural pattern region formed on the remaining portion of the top surface of the lower clad layer.

The substrate may be a sapphire substrate.

The lower clad layer and the upper clad layer may be formed of gallium nitride-based materials.

The first electrode may include at least one material selected from the group consisting of Ag, Al, Rh, Pd, Ni, and Pt.

The second electrode may include at least one material selected from the group consisting of Al, Cr, Ti, and Au.

The thickness of the lower clad layer may be 1 to 10 μm.

The width of the protrusion and recess structure may be 0.1 to 10 μm and the height of the protrusion and recess structure may be 0.1 to 10 μm.

According to another aspect of the present disclosure, there is provided a method of manufacturing a semiconductor light emitting device having a protrusion and recess structure, the method including: forming a lower clad layer on a substrate;

forming an active layer and an upper clad layer on the lower clad layer; forming a protrusion and recess structural pattern on a portion of the top surface of the upper clad layer by etching a portion of the lower clad layer; and forming a first electrode on the upper clad layer and forming a second electrode on the protrusion and recess structural pattern of the lower clad layer.

The forming of the protrusion and recess structural pattern may include: exposing the portion of the lower clad layer using a first etching process; and forming the protrusion and recess structure using a second etching process.

The second etching process may be one of a dry etching process and a wet etching process.

The wet etching process may be performed using one of an aqueous $H_3PO_4$ solution and an aqueous KOH solution.

The wet etching process may be performed in the range of 100 to 300° C.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS

Hereinafter, the present invention will be described more fully with reference to the accompanying drawings, in which exemplary embodiments of the invention are shown.

Figure 1:
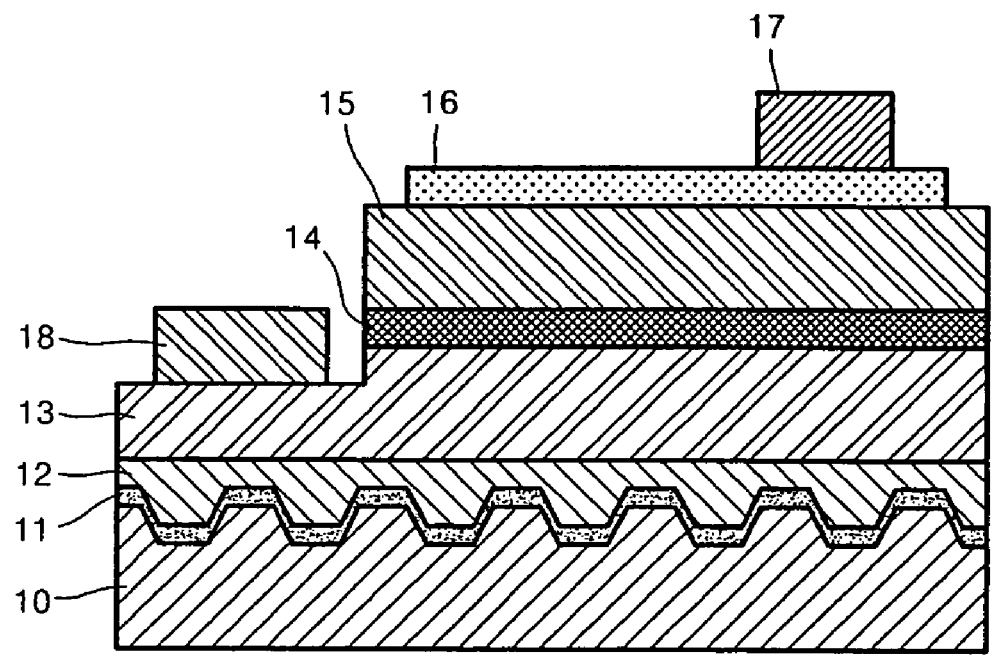
FIGS. 1 and 2 are cross-sectional views of conventional semiconductor light emitting devices having a protrusion and recess structure.
Figure 2:
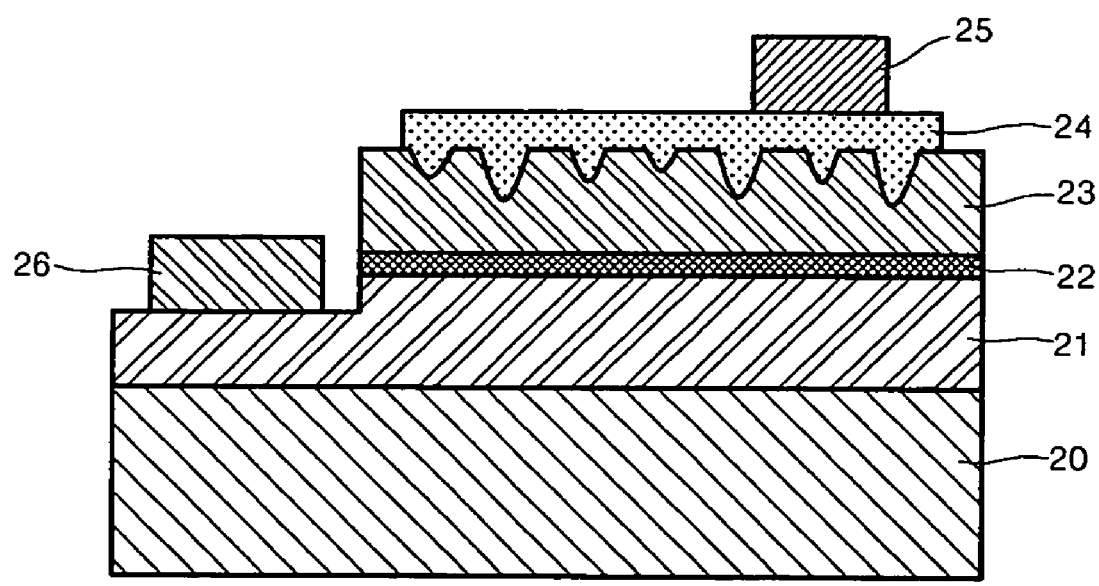
Figure 3:
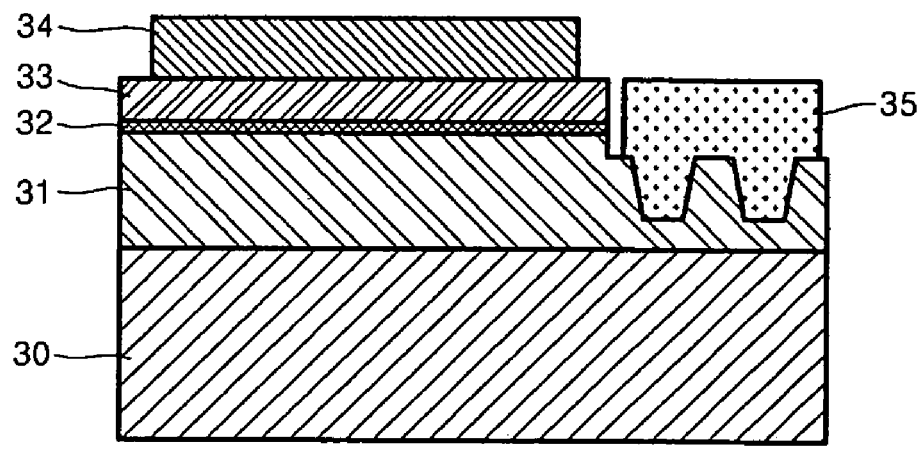
FIG. 3 is a cross-sectional view of a light emitting device having a protrusion and recess structure according to an embodiment of the present disclosure.

FIG. 3 is a cross-sectional view of a light emitting device having a protrusion and recess structure according to an embodiment of the present disclosure.

Referring to FIG. 3, a lower clad layer 31 is formed on a substrate 30 and an active layer 32, an upper clad layer 33 and a first electrode 34 are formed sequentially on a portion of the upper surface of the low clad layer 31. The protrusion and recess structure is formed on the upper surface of the other portion of the lower clad layer 31. A second electrode 35 is formed on the upper surface of the protrusion and recess structure. In the present embodiment, the protrusion and recess structure is formed at the interface between the lower clad layer 31 and the second electrode 35. The protrusion and recess structure is formed between the lower clad layer 31 and the second electrode 35 to scatter the light that arrives at the interface between the lower clad layer 31 and the second electrode 35 when the light generated from the active layer 32 is trapped between the lower clad layer 31 and the upper clad layer 33 due to total reflection.

According to an embodiment of the present disclosure, materials forming the substrate 30, the lower clad layer 31, the active layer 32, the upper clad layer 33, the first electrode 34 and the second electrode 35 of the semiconductor light emitting device having the protrusion and recess structure are not restricted, and may be any materials used in general conventional semiconductor light emitting devices. Particularly, material used in a gallium nitride-based compound semiconductor device can be used. For example, the substrate 30 can be a semiconductor substrate or a sapphire substrate and the lower clad layer 31 and the upper clad layer 33 can be formed of n-GaN or p-GaN. Also, the active layer 32 can be a MQW. The first electrode 34 can be formed of a conventional material for an electrode such as Ag, Al, Rh, Pd, Ni or Pt, and the second electrode 35 can be formed of Al, Cr, Ti or Au.

Hereinafter, referring to FIGS. 4A through 4D, a method of manufacturing the semiconductor light emitting device having the protrusion and recess structure according to an embodiment of the present disclosure will be described in detail.

Figure 4A:
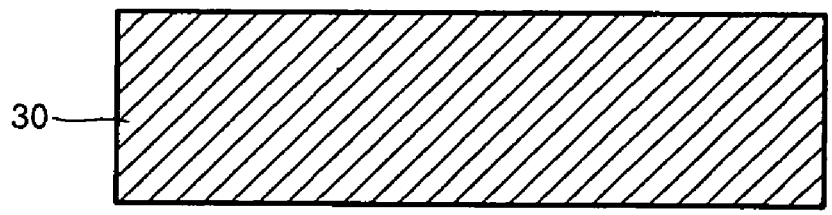
FIGS. 4A through 4D illustrate a manufacturing method of a light emitting device having a protrusion and recess structure according to an embodiment of the present disclosure.

Referring to FIG. 4A, the substrate 30 is prepared. The substrate is a semiconductor substrate or a sapphire substrate.

Figure 4B:
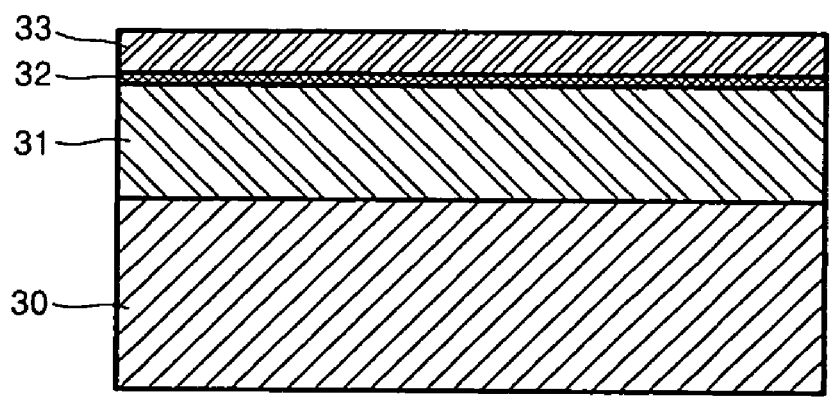

Referring to FIG. 4B, the lower clad layer 31, the active layer 32 and the upper clad layer 33 are sequentially formed on the substrate 30. The lower clad layer 31 and the upper clad layer 33 are formed of commonly used materials including GaN. For example, the lower clad layer 31 is formed of n-GaN and the upper clad layer 33 is formed of p-GaN.

Figure 4C:
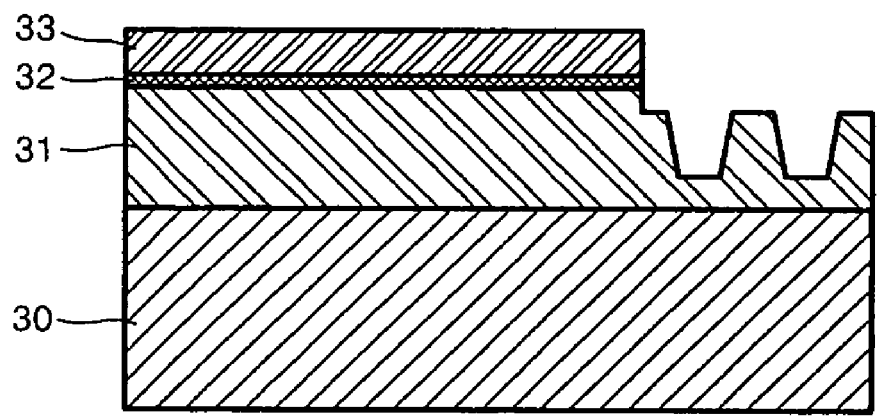

Referring to FIG. 4C, portions of the lower clad layer 31, the active layer 32 and the upper clad layer 33 on the sapphire substrate 30 are etched. In detail, first, the upper clad layer 33 and the active layer 32 are etched vertically. This can be performed conveniently using a dry etching process such as reactive ion etching (RIE). Therefore, the lower clad layer 31 is exposed. Then, an etching process is performed on the exposed lower clad layer 31 to form the protrusion and recess structure. At this time, a dry etching process or a wet etching process can be used. In more detail, a wet etching process is performed using $H_3PO_4$ and KOH aqueous solutions in the range of 100 to 300° C. for a few minutes to tens of minutes. The etching time can be selected according to the thickness of the lower clad layer 31. The lower clad layer 31 can be formed to a thickness of 1 to 10 μm and the width and the height of the protrusion and recess structure can each be formed to 0.1 to 10 μm.

Figure 5:
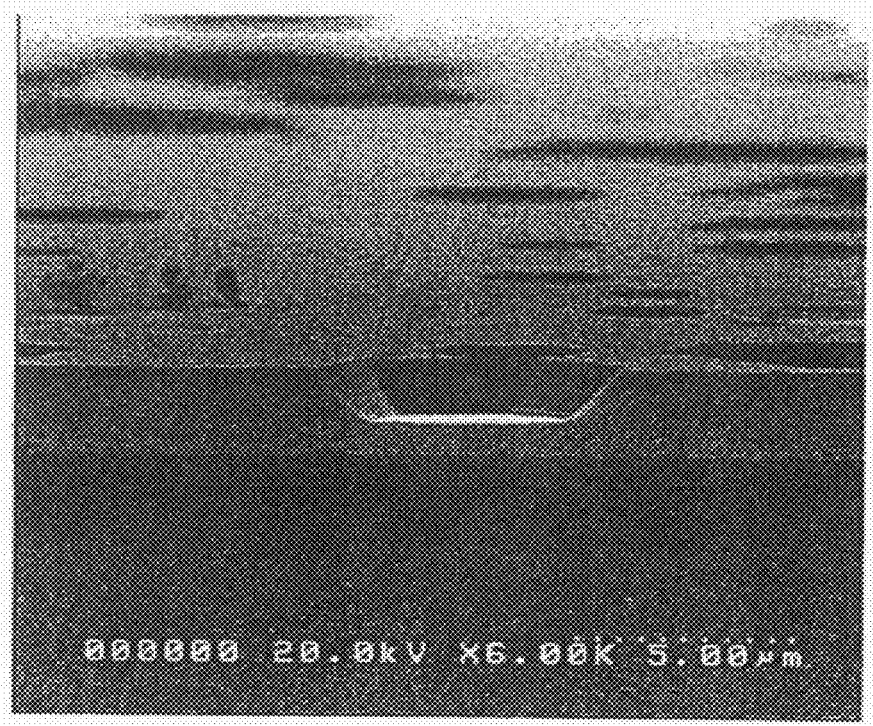
FIG. 5 is an image showing the protrusion and recess structure formed according to the method illustrated in FIGS. 4A through 4D.

FIG. 5 is a sectional image of the protrusion and recess structure formed on the exposed surface of the lower clad layer 31 using the etching process described with reference to FIG. 4C. In FIG. 5, the wet etching was performed at 220° C. for about 10 minutes using an aqueous $H_3PO_4$ solution. Referring to FIG. 5, a trapezoid-shape groove was made in the lower clad layer 31 through the etching process.

Figure 4D:
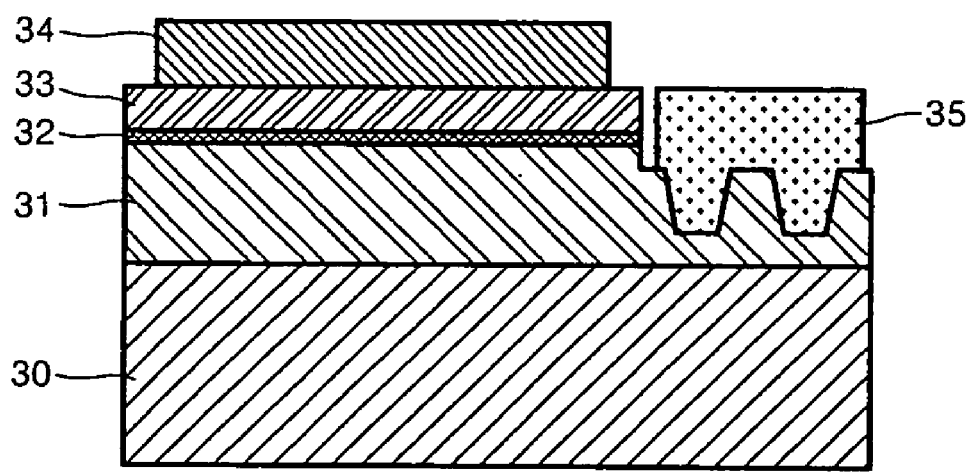

Referring to FIG. 4D, the semiconductor light emitting device is completed by forming the first electrode 34 on the upper clad layer 33 and the second electrode 35 on the protrusion and recess structure.

Figure 6:
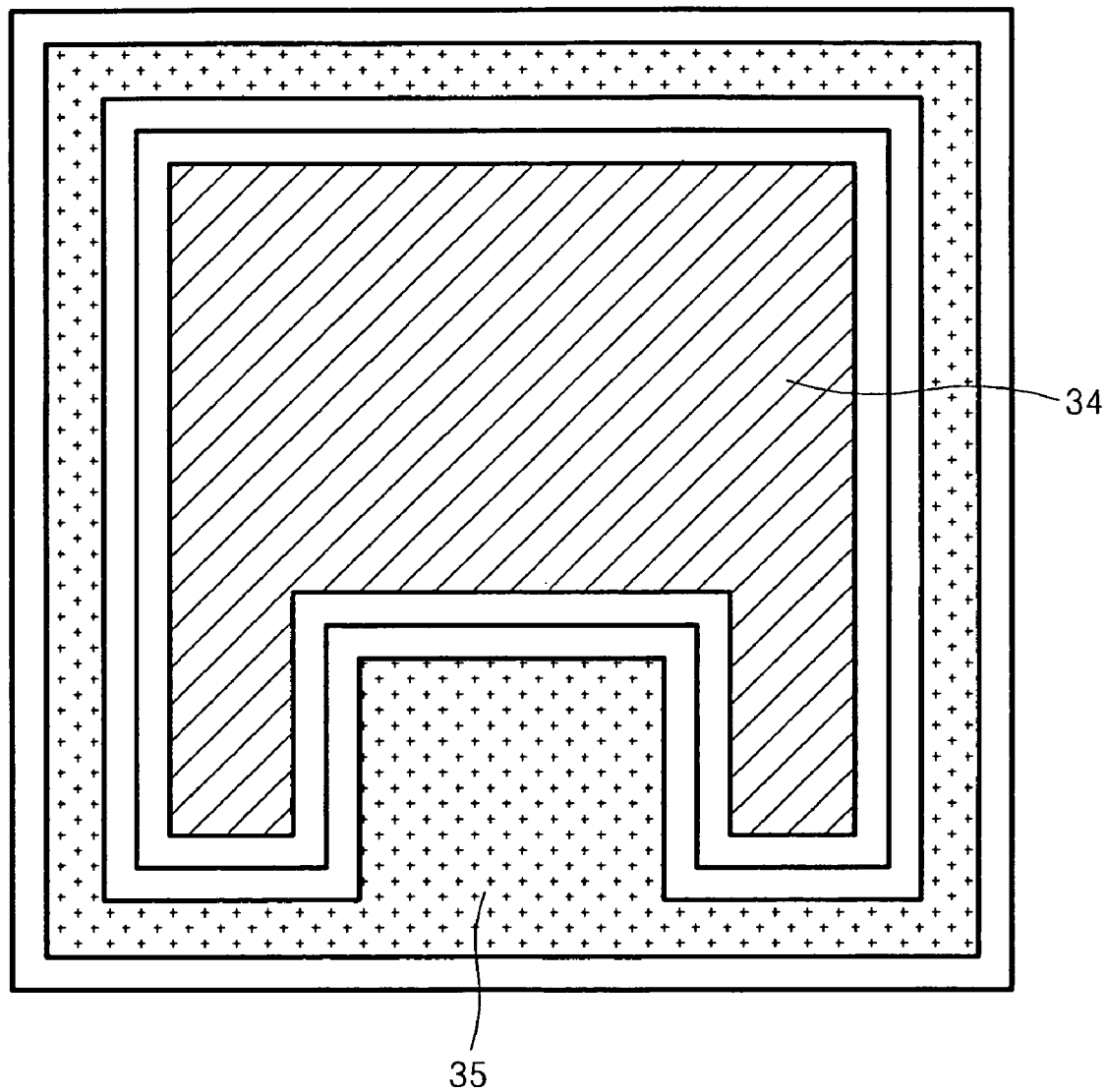
FIG. 6 is a plane view of a semiconductor light emitting device formed according to an embodiment of the present disclosure.

FIG. 6 is a plan view of a light emitting device having the protrusion and recess structure and a surface area of 320×320 $μm^2$ according to an embodiment of the present disclosure. Referring to FIG. 6, the second electrode 35 having the protrusion and recess structure takes up 30% of the total surface area of the device. That is, when the light generated from the active layer 32 is trapped inside the light emitting device and totally reflected, the region to which the light can be scattered is not small.

Figure 7A:
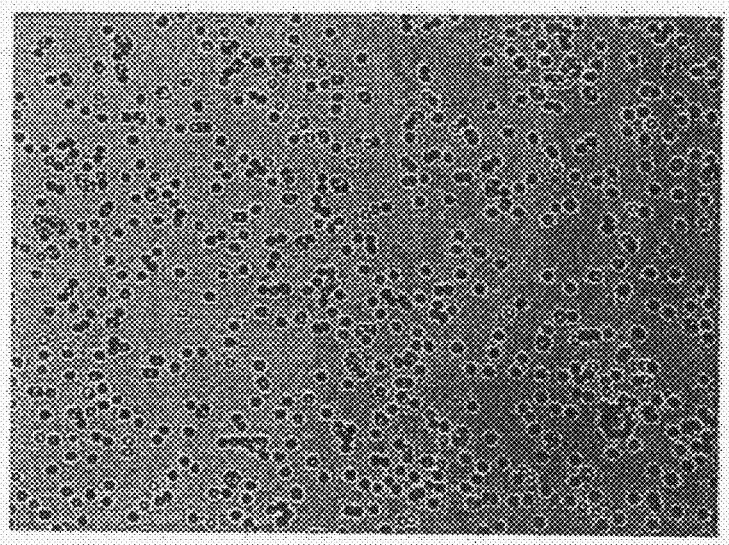
FIGS. 7A and 7B are images of protrusion and recess structures taken after being etched under different conditions in the manufacturing of semiconductor light emitting devices according to the present disclosure.
Figure 7B:
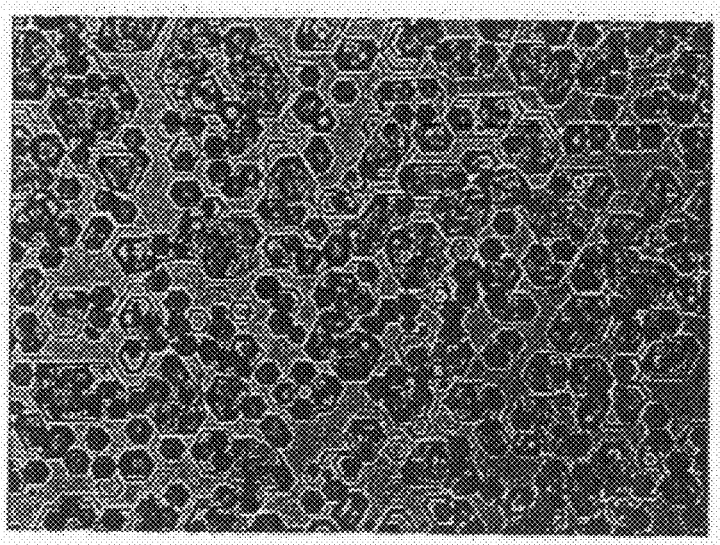

FIGS. 7A and 7B are images of the surface of the lower clad layer 32 after performing an etching process for forming the protrusion and recess structure under different conditions according to embodiments of the present disclosure.

FIG. 7A is an image of the surface of the lower clad layer 32 after performing the etching process at 200° C. using an aqueous $H_3PO_4$ solution for approximately 10 minutes. Here, the width of the etched region (pit) was approximately 2 μm and a depth was less than approximately 1.5 μm.

FIG. 7B is an image of the surface of the lower clad layer 32 after performing the etching process at 220° C. using an aqueous $H_3PO_4$ solution for approximately 10 minutes. Here, the width of the etched region (pit) was approximately 5 μm and a depth was less than approximately 2.5 μm.

Referring to FIGS. 7A and 7B, when forming the protrusion and recess structure under similar conditions but at slightly different temperatures, the dimensions of the formed protrusion and recess structure showed a big difference. Thus, the size of the protrusion and recess structure can be easily controlled by making a simple change in the condition of the wet etching process.

Figure 8:
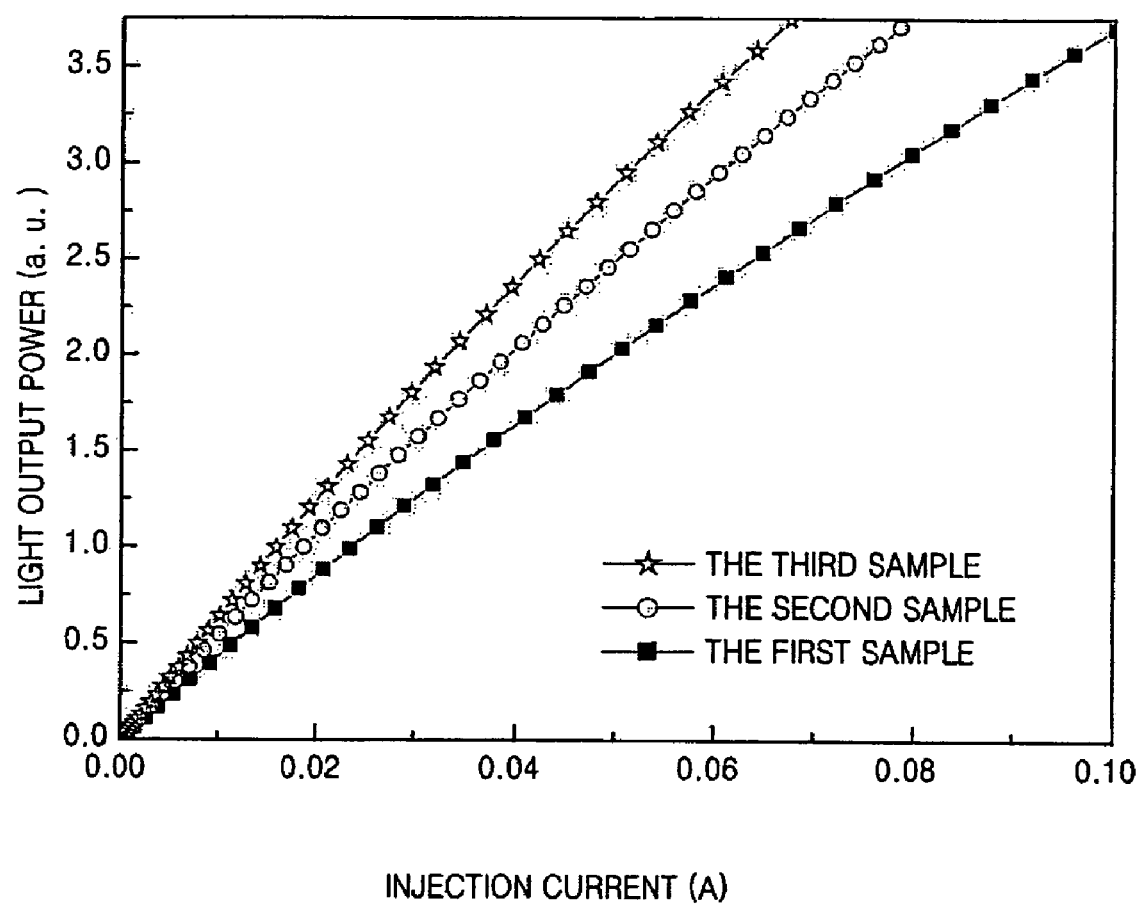
FIG. 8 is a graph of light output power versus width ratio of an electrode region of the portion of a light emitting device having a protrusion and recess structure according to an embodiment of the present disclosure.

FIG. 8 is a graph of light output power versus current for semiconductor light emitting devices having the protrusion and recess structure manufactured using the etching processes described with reference to FIGS. 7A and 7B and a conventional semiconductor light emitting device without the protrusion and recess structure.

Referring to FIG. 8, 3 samples were used. The first sample did not have the conventional protrusion and recess structure, and is indicated by squares in FIG. 8. The second sample was the semiconductor light emitting device for which the etching process for forming the protrusion and recess structure was performed for approximately 10 minutes at 200° C. using an aqueous $H_3PO_4$ solution, as illustrated in FIG. 7A. The third sample was the semiconductor light emitting device for which the etching process for forming the protrusion and recess structure was performed for approximately 10 minutes at 220° C. using an aqueous $H_3PO_4$ solution, as illustrated in FIG. 7B. As indicated by the results of the third sample, when the size (width and height) of the protrusion and recess structure formed at the interface between the lower clad layer 31 and the second electrode 35 using the etching process was large, the light output power was high. At 20 mA, the second sample showed 25% higher light output power than the first sample and the third sample showed 46% higher light output power than the first sample.

According to the present disclosure, the protrusion and recess structure formed at the interface between the lower clad layer and the second electrode of the semiconductor light emitting device greatly improves the light extraction efficiency from the active layer, and the semiconductor light emitting device having the protrusion and recess structure at the interface between the lower clad layer and the second electrode is simpler to manufacture than a conventional semiconductor light emitting device having the protrusion and recess structure.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor light emitting device having a protrusion and recess structure, the method comprising:
    forming a lower clad layer on a substrate;
    forming an active layer and an upper clad layer on the lower clad layer;
    forming a protrusion and recess structural pattern on a portion of the top surface of the lower clad layer by etching a portion of the lower clad layer wherein the forming of the protrusion and recess structural pattern comprises: exposing the portion of the lower clad layer using a first etching process; and forming the protrusion and recess structural using a second etching process second occurrence; and
    forming a first electrode on the upper clad layer and forming a second electrode on the protrusion and recess structural pattern of the lower clad layer.

2. The method of claim 1, wherein the second etching process is one of a dry etching process and a wet etching process.

3. The method of claim 2, wherein the wet etching process is performed using one of an aqueous $H_3PO_4$ solution and an aqueous KOH solution.

4. The method of claim 2, wherein the wet etching process is performed in a range of 100 to 300° C.

5. The method of claim 1, wherein forming of the protrusion and recess structural pattern comprises forming of the protrusion and recess structural pattern all the way around a portion of the lower clad layer occupied by the active layer.

* * * * *